United States Patent [19]
Olson

[11] Patent Number: 5,635,256
[45] Date of Patent: Jun. 3, 1997

[54] METHOD OF MAKING A DIAMOND-COATED COMPOSITE BODY

[75] Inventor: James M. Olson, Framingham, Mass.

[73] Assignee: St. Gobain/Norton Industrial Ceramics Corporation, Worcester, Mass.

[21] Appl. No.: 633,344

[22] Filed: Apr. 17, 1996

Related U.S. Application Data

[63] Continuation-in-part of Ser. No. 289,356, Aug. 11, 1994, abandoned.

[51] Int. Cl.$^6$ ............................................ B05D 3/06
[52] U.S. Cl. .................... 427/535; 427/540; 427/577; 427/249; 51/309; 51/295
[58] Field of Search ................... 427/540, 577, 427/535, 249; 51/295, 309; 428/408, 698, 908.8

[56] References Cited

U.S. PATENT DOCUMENTS

| | | | |
|---|---|---|---|
| 5,204,167 | 4/1993 | Saijo et al. | 428/212 |
| 5,236,740 | 8/1993 | Peters et al. | 427/249 |
| 5,342,660 | 8/1994 | Cann et al. | 427/577 |

OTHER PUBLICATIONS

Haubner et al, Diamond and Related Materials, 2(1993) pp. 1505–1515.

Park et al, Diamond and Related Materials, 2(1993) pp.910–917.

*Primary Examiner*—Roy V. King
*Attorney, Agent, or Firm*—Volker R. Ulbrich

[57] ABSTRACT

At least the surface region of a cutting tool substrate made of tungsten carbide in a cobalt matrix is carburized to chemically passivate the cobalt prior to deposition of diamond film on it. The passivation improves adhesion by preventing reaction of the cobalt with the diamond in the course of the deposition process. To further improve adhesion of the diamond, cobalt is removed from the exposed surfaces of the tungsten carbide grains by heat treatment in inert gas or by hydrogen plasma.

18 Claims, 1 Drawing Sheet

METHOD OF MAKING A DIAMOND-COATED COMPOSITE BODY

CROSS REFERENCE TO RELATED APPLICATIONS

This is a continuation-in-part of application Ser. No. 08/289,356 filed Aug. 11, 1994, now abandoned.

FIELD OF THE INVENTION

The invention relates to articles which are coated with diamond and more specifically to cutting tools made of cemented carbide which are coated with diamond by chemical vapor deposition (CVD).

BACKGROUND OF THE INVENTION

For many applications, diamond is a highly desirable material as a coating on a substrate base material. However, where the coating is subjected to severe mechanical loads, its adherence to the base material may fail and result in spalling away of the coating. This is particularly true for cutting tools which are coated with a thin layer of CVD diamond to improve resistance to wear.

One of the most important base materials for various kinds of both flat and round cutting tools is cemented carbide, such as tungsten carbide. Tungsten carbide is a composite of tungsten carbide particles embedded in a binder matrix of cobalt. This material is particularly useful for cutting tools because of its toughness. The provision of a thin coating of diamond on it would be very advantageous because it would in effect combine the benefits of the much harder diamond with the superior toughness of the tungsten carbide substrate to result in a tool which is both very tough and very hard. However, it has been found that it is very difficult to apply a coating of CVD diamond to tungsten carbide such that it forms both a mechanical and a chemical attachment to the tungsten carbide which will be so strongly adherent that during cutting it will wear off, rather than just spall off the surface. The difficulty in providing an adherent coating of CVD diamond to tungsten carbide is generally attributed to the presence of the cobalt, which at the elevated temperatures needed for the CVD diamond deposition acts as a catalyst for conversion of the diamond to graphitic carbon.

Attempts have been made by others to reduce or eliminate the cobalt from the surface to which the diamond is applied in order to improve the adherence. One approach has been to etch away some of the surface cobalt with acid. However, this may leave a portion of the tungsten carbide grains without sufficient mechanical support to the remaining composite to provide a sound bond for diamond deposited on the surface. Another approach has been to provide an interlayer of material, such as a carbide-forming metal, which will bond to both the base material and the diamond. Titanium may be used for this. However, the presence of an interlayer further complicates the manufacturing process.

There is a need for a process which will permit the deposition by CVD of a diamond coating directly on a substrate, especially tungsten carbide, so that it forms a strong physical and chemical bond with the substrate surface to prevent spalling under severe mechanical loads.

SUMMARY OF THE INVENTION

Deleterious reaction of the binder material with the deposited diamond may be reduced or completely eliminated by altering the chemical composition of the binder material in at least a surface region of the substrate prior to deposition of the diamond on it. For the case of tungsten carbide in a cobalt matrix, the cobalt matrix material in at least a surface region of the substrate is preferably passivated with added carbon by plasma treatment, mechanical abrasion, or other forms of carburization to reduce or eliminate its undesirable reactivity with diamond or diamond growth species in the deposition gases and the resulting degradation of the diamond during the deposition process.

DETAILED DESCRIPTION

Figure 1:
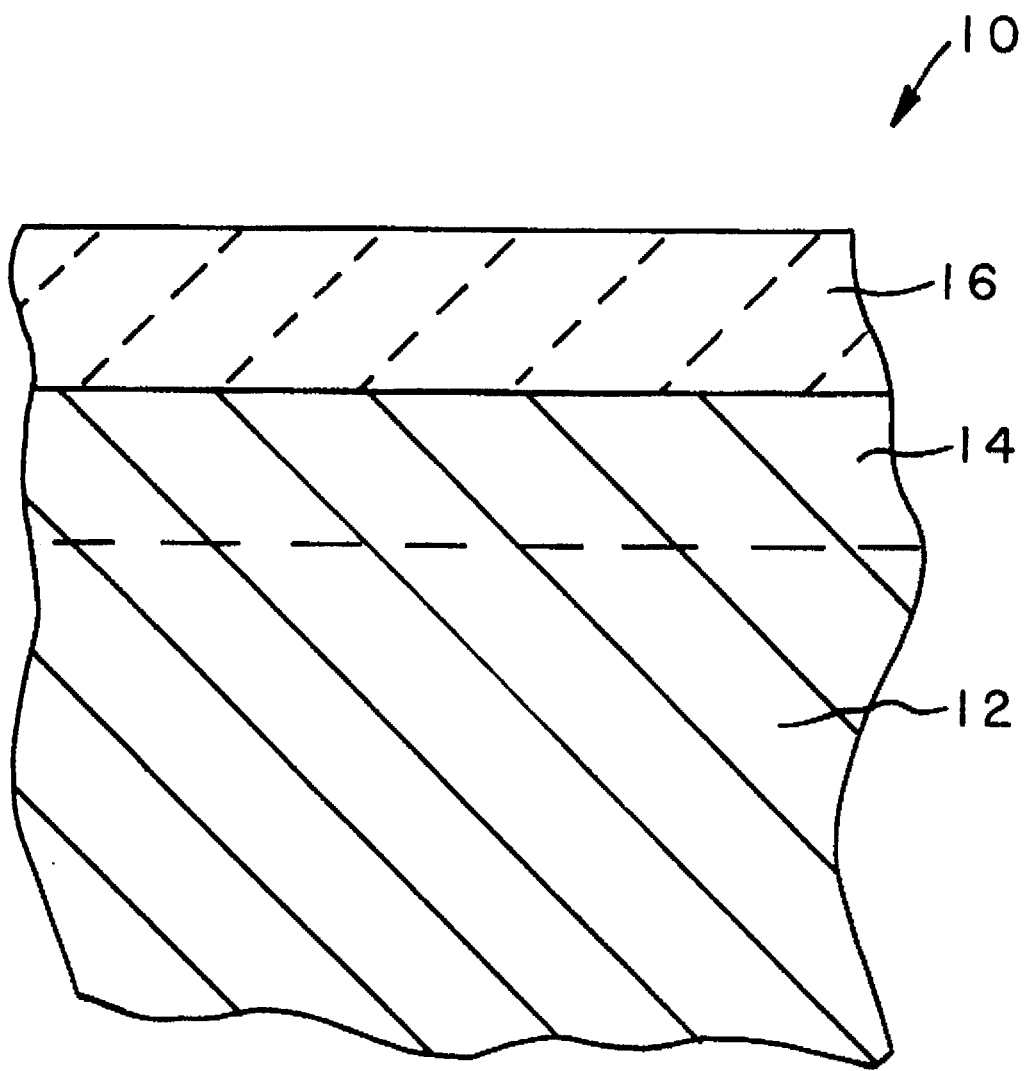
FIG. 1 is a schematic cross-sectional view of a fragment of a substrate of base material which has been coated with CVD diamond in accordance with one embodiment of the present invention.

In accordance with the invention, a cutting tool insert 10, of which a fragment is shown in FIG. 1, consisting of a base material substrate 12 of commercially-available tungsten carbide with up to 6% Co by weight binder material and having an average particle size in the range of from about 1 to about 2 microns is first treated so that a surface region 14 of the insert 10 becomes substantially saturated with carbon. Thereafter, the insert 10 is coated with a thin layer of diamond film 16 to improve its cutting tool performance.

While turning A390 Al (18% Si) under aggressive continuous conditions (680 m/min, 0.2 mm/rev, 1.0 mm depth of cut with coolant) the diamond coated WC-Co TPG321 and TPG322 inserts showed a performance which was equal to or better than PCD tools of the same geometry.

Preparation of the Surface Before Deposition:

The substrate 12 material has an initial surface roughness of greater than 0.2 microns (micro-meters). The substrate 12 may or may not be honed prior to its pre-deposition preparation. The primary purpose of honing would be to increase the radius of any cutting edges of the tool in advance of the deposition of diamond on it in order to distribute the cutting load at that edge. In addition, such honing treatment may also serve to remove surface contaminants from the substrate surface, remove loosely bound WC material and/or remove defects or chips at the cutting edge tips of the tools in order to provide a suitable foundation for the diamond coating. In some applications, the geometrical result of the honing process may or may not be beneficial, whereas the mechanical abrasion of the process may be advantageous to the adhesion of the diamond film for reasons which will be discussed below.

The substrate 12 is next cleaned by immersing it in an ultrasonic cleansing tank in a degreasing solution bath which is ultrasonically agitated for about 15 minutes. An example of a suitable degreasing solution is one part by volume of ESMA E484, a commercially-available degreasing compound marketed by Esma Chemicals Inc., of Highland Park, Ill. in 1994, in two parts de-ionized water. After the first 15 minutes, the substrate material is removed and mechanically cleaned with a cotton swab using one part of the degreasing solution diluted with 2 parts deionized water until no more contaminants are removed by this action as indicated by lack of further discoloration of the swab. The substrate material is then again placed in a clean ultrasonic bath of degreasing solution, cleaned for an additional 15 minutes, removed from the ESMA E484 solution, thoroughly rinsed in an ultrasonic bath of pure de-ionized water, and then blown dry with nitrogen.

With the substrate material now clean, it is immersed in a room temperature solution of 10% by volume of concentrated nitric acid (69–71% purity; specific gravity 1,423 grams per cc) in de-ionized water and ultrasonically agitated for about 1 to about 15 minutes in order to remove some cobalt binder from the surface region 14 to a depth of about 4 to about 15 microns, respectively. It is critical to the performance of the insert 10 that the etching action not be too aggressive. Similarly, it is important that enough cobalt is removed from the surface region 14 to ensure that the adhesion of the deposited diamond is not critically affected. Specific details of the effect of the etch depth on performance are given below in the "Examples" section. Defining the optimum amount of cobalt to be removed from the near surface region may be dependent upon the particular application.

For the etching depth range of interest, there appears to be a nearly linear relationship between etch depth and the mass of cobalt removed per unit surface area. With too aggressive an etching, such as by the use of overly concentrated acid or too long an etch time, the free surface of the substrate material will contain free or loosely bonded WC grains which result in a weak interface between the diamond film and the substrate. In addition, aggressive etching is known to decrease the fracture toughness the free surface of the tool such that the edges and tips of the substrate are embrittled and may not be able to support more intense cutting loads of some specific applications. Following the etching treatment, the substrate material is then rinsed for 3–5 minutes in pure de-ionized water, again in an ultrasonic bath.

Next, the substrate material is placed in a seed solution of 0.35 grams of $\leq 0.1$ micron diameter diamond powder in 100 ml (milliliters) of isopropyl alcohol and ultrasonically vibrated for 20 minutes. It is then again rinsed in de-ionized water in order to remove excess seed solution and blown dry with nitrogen.

Diamond Deposition:

Diamond deposition is performed in a 2.45 GHz or 915 MHz microwave plasma CVD reactor of the type described, for example in U.S. Pat. No. 4,777,336 at a temperature of 750 degrees C. to 950 degrees C. using various concentrations of methane in hydrogen from 0.5% to 2.0% by volume as measured by mass flow rates. The substrate material may or may not be annealed in activated molecular hydrogen plasma while heating up to deposition temperature. The annealing time, as well as the temperature at which methane is introduced into the reaction chamber, directly affect the nucleation density. Deposition at steady state continues for a period sufficient to result in a diamond film with a thickness of between 10 and 50 microns.

It is believed that specific characteristics of the diamond film are critical for acceptable performance of the finished diamond-coated tool 10. The acceptable range for these particular characteristics may be application-dependent. A more forgiving application will require less rigorous definition, while more aggressive applications will require attention to specific details. While all of these characteristics may not be directly related to the degree of adhesion of the diamond to the substrate of the product, they may nevertheless affect the over-all performance of the tool in the specific application.

A low methane concentration of, for example, less than 1% methane in hydrogen, results in a well-faceted, highly sp3-bonded polycrystalline diamond film. While this type of film has high strength, the well-faceted, large diamond crystals make for a relatively rough cutting edge and surface.

A smoother cutting surface would be likely to bring with it the benefit of decreased thermal heating by friction, decrease material build-up during cutting, and also, perhaps, a superior finish to the work-piece in some applications. The smoother cutting surface may be achieved by increasing the methane concentration during deposition in order to deposit a diamond layer with smaller micro-crystals over a base of larger, well-faceted crystals. This may result in a high quality/high strength, stress-supporting foundation at the diamond/substrate interface and a smoother, micro-crystalline cutting surface.

In practice, the methane concentration is increased during deposition from low (less than 1%) to high (2% or higher) in gradations. This is done in order to ensure that the transition from the well-faceted, larger crystals to the micro-crystals will result in a smooth cutting surface. Also, low methane concentration results in slower growing, but better quality diamond with greater tensile strength at the interface and probably leads to a stronger adhesion for this reason. The low methane conditions also encourage carburization of the cobalt in the surface region of the substrate before effective nucleation of diamond takes place.

Following a deposition time long enough to ensure a film thickness of between 10 and 50 microns, the substrate is annealed at the deposition temperature for about one-half hour in a hydrogen plasma. Thereafter it is slowly cooled by about 500 degrees C. over a period of about 40 minutes by decreasing the chamber pressure to lower the power density of the plasma. At that time power to the plasma is shut down and the substrate is allowed to cool to room temperature. The annealing step may alternatively be done in part by gradually decreasing the microwave power or the deposition chamber pressure or both. Alternatively, an active heater may be used to slowly decrease the temperature of the substrate.

EXAMPLE 1

A tungsten carbide (6% by weight of cobalt) cutting tool insert of type TPG321 VC2 WC-Co manufactured by GTE-Valenite Corporation was honed to an edge radius of about 35 microns, cleaned with the procedure described above, and etched for 10 minutes using the procedure described above. Cobalt was removed to a depth of about 9 microns into the WC-Co substrate and the substrate then seeded using the procedure described above. The substrate was coated with diamond film to a thickness of approximately 19 microns using microwave plasma-enhanced CVD (chemical vapor deposition) at a power of about 700 watts as described above and using the following methane concentrations: 0.5% for the first 15 hours, 1.0% for the next 15 hours and 2.0% for last 15 hours. The average deposition substrate temperature was about 860 degrees C.

The resulting coated insert was then tested in a turning application on A390 grade high silicon aluminum (18% Si) under the following conditions: 680 m/min, 0.2 mm/rev, 1.0 mm depth of cut using liquid coolant. The performance of the coated insert was compared to that of a similar insert which had not had its surface treated and coated with diamond. Each sample was tested for 5 minutes and the resulting wear measured. The failure criterion was a measured flank wear of about 0.015 in. (0.38 mm). The uncoated WC-Co lasted less than 5 seconds with a wear of about 0.016 in. (0.41 mm). The insert which had been coated with diamond in accordance with the invention showed a measured flank wear of only about 0.0056 in. (0.0142 cm) and had not yet been worn through the diamond film to the substrate.

EXAMPLE 2

A cutting tool insert of configuration type TPG321 (sample A) and another of type TPG 322 (sample B) of the same tungsten carbide material as the insert of example 1 were prepared using the same procedure described in Example 1 above. The sample A was coated with a film thickness of about 20 microns while sample B was coated with a diamond film thickness of about 25 microns. Both samples were tested in a turning operation using A390 aluminum (18% Si) in an interrupted facing operation with the following characteristics: a 14 cm diameter log with two 1.2 cm wide, axially-extending, opposing slots in the perimeter and an outer diameter velocity of about 1000 m/min, an inner diameter velocity of about 180 m/min, a feed rate of about 0.2 mm/rev, and a depth of cut of about 1.0 mm. Sample (B) was tested for 150 passes and removed about 130 cubic inches of material. The flank wear following this test was about 0.0034 in. (0.0086 cm). Neither Sample (A) nor (B) was worn through the diamond film as a result of the testing.

It has been found that it is advantageous for obtaining adherence of diamond film to the surface of tungsten carbide to carburize the surface cobalt matrix material to chemically stabilize it and to remove the surface cobalt by gas-assisted methods, instead of by wet etching as in examples 1 and 2. Wet etching has a tendency to result in some undercutting of surface tungsten carbide grains, thereby weakening their attachment to the underlying bulk. Moreover, since the cobalt matrix is not entirely homogeneous, but includes different phases of tungsten, carbon, and cobalt combinations, especially at the interface between the tungsten carbide grains and the cobalt matrix, wet etching tends to remove some phases more rapidly than others to result in a porous matrix structure between the surface tungsten carbide grains. This also weakens the attachment of the tungsten carbide grains to the underlying bulk material and reduces the ability of diamond deposited on the surface to tightly adhere to it. Gas-assisted methods of removing the surface matrix, on the other hand, result in much less undercutting and are less selective in the removal of the cobalt matrix phases. The examples 3 and 4 below illustrate gas-assisted cobalt removal methods in accordance with the invention.

EXAMPLE 3

A cobalt matrix tungsten carbide cutting tool insert of the configuration type TPG321 which may or may not have had its surface ground to increase its roughness has its matrix carburized and least substantially all of the surface cobalt, that being the cobalt on the exposed surface of the tungsten carbide grains, is removed by treatment in a furnace. The insert is placed in a container of porous graphite felt inside a furnace filled with nitrogen at a pressure of about between about 0.5 and 2 Torr. A colloidal graphite coating is applied to the surface on which the insert is placed to prevent sticking. The furnace is brought up to a temperature of about 1500 degrees C. for about 0.5 hour and then turned off to cool to near room temperature over the course of about 2 hours. In the furnace treatment, carbon which sublimes from the graphite container dissolves in the cobalt matrix to carburize it for preventing formation of brittle phases and for otherwise chemically stabilizing the cobalt. At the same time cobalt which may be present on the surface grains of tungsten carbide and in the shallow surface region between them is removed by vaporization in the process to expose clean tungsten carbide grains for coating with diamond film and to minimize the total surface area of cobalt which is exposed to the diamond film growth process. In addition, some sintering of the surface tungsten carbide grains occurs and results in grain growth which provides greater surface roughness for increasing the toughness of the tungsten carbide composite interface with the diamond.

The insert is then removed from the furnace and coated with diamond film by CVD in an arc jet as described above. The diamond coating process is begun with a concentration of 0.4% methane for about 40 minutes to provide conditions favorable for diamond nucleation, then dropped to from 0.11% to 0.12% for the remaining deposition time of about 180 minutes to a diamond film thickness of 15–25 microns.

EXAMPLE 4

A cobalt matrix tungsten carbide cutting tool insert of the configuration type TPG321 is placed in a furnace as in example 3 above, but with a hydrogen gas atmosphere instead of a nitrogen one. The remainder of the process is similar to that of example 3. The hydrogen accelerates the removal of surface cobalt by forming cobalt hydrides, which are removed from the furnace as a gas.

EXAMPLE 5

In a particularly advantageous process for both carburizing the cobalt matrix of a tungsten carbide cutting tool and removing surface cobalt matrix, a cobalt matrix tungsten carbide cutting tool insert of the configuration type TPG321 is placed in the deposition chamber of an arc jet or other plasma jet at a pressure of about 10 Torr in an atmosphere of hydrogen. The surface of the insert may or may not have been previously ground to roughen the surface. The surface of the insert is treated with the plasma jet and maintained at a temperature of about 1200–1350 degrees C. for about 0.5 hour by controlling the power of the plasma generating apparatus. During this time, methane is added to the hydrogen at a concentration of 0.1% or less for five minutes every five minutes, then turned off for five minutes. The added methane suppresses the formation of the eta phase in the cobalt. It is also suspected that the dissolution of hydrogen in the cobalt reduces the melting temperature of the cobalt and thereby leads to much more rapid vaporization than if the hydrogen were not present. Some cobalt hydride may also be forming as a gas and thereby accelerating cobalt removal. Thereafter, the surface of the insert is coated with diamond film. The diamond coating may be performed in a different system or in the same system by arc jet deposition as described above.

A distinct advantage of this approach is that the deposition rate of the arc jet is so high that there is insufficient time for the cobalt to diffuse into the growing diamond and form graphite at the interface, particularly since the cobalt has been chemically stabilized by the carburization with the methane. The predeposition treatment can be carried out at a high temperature because the time is too short to result in degrading changes in the cobalt matrix. Furthermore, the time for removal of the surface cobalt can be made so short that no significant grain growth occurs in the surface tungsten carbide grains. However, if grain growth is desired for increasing surface roughness, it can be provided by lengthening the heat treatment time and lowering the temperature accordingly. For example, if prior to being coated with diamond film the insert is subjected to a plasma jet in hydrogen for a period of about 0.5 hours and maintained at a temperature of about 1300 to about 1400 degrees C., significant grain growth will result.

General Considerations

As discussed above, several characteristics of the diamond-coated WC-Co insert may have a range of acceptable values. The optimal value for particular characteristics may be solely dependent on the particular application in which the diamond coated tool is to be used. The following is a summary of acceptable ranges of some critical parameters and description of the effect of the variation of the value within the range.

There are some indications that the substrate should have a pre-deposition surface roughness greater than about 0.064 microns. The pre-deposition surface roughness used for the above examples is between 0.2 and 0.4 microns. The increased roughness results in improved adherence of the diamond.

The honing does not appear to affect the adhesion strength of the diamond film. The honing radius does affect the surface finish of the workpiece, however. In addition, based on some surface observations of the effect of wet etching on the appearance of the substrate surface, it appears that there may be a mask effect due to mechanical treatment of the substrate. Examination of several samples appears to indicate that adhesion is optimal at the cutting edge of the diamond coated WC cutting tools in a region which correlates directly with the region affected by the mechanical abrasion of the honing process. Both wet etching and cobalt diffusion are affected in this region. It appears that the mechanical treatment abrades the surface in such a way as to form an active barrier to cobalt mobility.

Samples which have been honed, cleaned and seeded, but not etched using the procedure described above to remove surface cobalt have spalled upon removal from the deposition chamber. It is believed that the minimal amount of cobalt binder removed from the substrate is application-dependent. For continuous turning of A390 or A356 Al for instance, the amount of cobalt removed from the substrate prior to deposition may not be as critical as that removed in a tool which will be used in abrasive interrupted cutting operations such as milling. Over-etching of the substrate material results in both embrittlement of the interface and production of loose WC material at the interface which results in a weak foundation for the diamond film. Sufficient carburization of the surface region material of the substrate may eliminate altogether the need for etching.

The methane concentration directly affects the nucleation of the diamond film. A coupled effect seems to exist between the methane concentration, seeding procedure, substrate deposition temperature and pre-deposition ramp procedure. In general, high nucleation is favored for abrasive applications. In the turning application described in Example A above, no difference in performance was seen between samples whose diamond films were grown under conditions which yield low nucleation density (about $10^4$ per square cm) and samples whose diamond films were grown under conditions which yielded higher nucleation densities (about $10^9$ per square cm).

The substrate temperature during deposition is important. For substrate temperatures in excess of about 950 degrees C., nucleation density is critically affected and a discontinuous film results. For temperatures less than about 760 degrees C., the deposition rate is extremely low.

While it appears from preliminary investigations that the seeding step was not critical to performance, it was observed in the nucleation studies that the nucleation was dramatically affected by the omission of the seeding step.

For most cutting tool applications, the diamond layer should be at least about 6 microns thick. Typically, the thickness is in the range of 10–25 microns. Tool life in general increases with increasing thickness of the film.

Although the present invention is particularly useful for cobalt-bonded tungsten carbide substrates coated with diamond, other composites, such as tungsten carbide in a different metal matrix or a different ceramic in a cobalt matrix may also present similar tendencies to degrade the diamond and could therefore benefit from the invention.

I claim:

1. A method of preparing the surface of a composite body which comprises particulates embedded in a binder material comprising:

passivating the binder material in at least the surface region of the body to a degree sufficient to permit the chemical vapor deposition of a diamond film on the body without significant chemical degradation of the diamond by the binder material and removing the binder material from the surface of exposed particulates by gas-assisted vaporization, leaving the passivated binder material at the surface between the exposed particulates.

2. The method of claim 1 wherein the gas-assisted vaporization includes heating the body in a furnace in an atmosphere of predominantly inert gas at a pressure of between about 0.5 and about 2 Torr.

3. The method of claim 2 wherein the atmosphere includes carbon vapor.

4. The method of claim 3 wherein the carbon vapor is supplied by vaporization from a solid carbon source within the furnace.

5. The method of claim 4 wherein the heating is for a period of between about 0.5 hours and about 2.0 hours.

6. The method of claim 1 wherein the vaporization is carried out by treating the surface of the body with a plasma in an atmosphere of elemental hydrogen.

7. The method of claim 6 wherein the hydrogen is at a pressure of about 5 Torr to about 100 Torr.

8. The method of claim 7 wherein the plasma treatment is carried out by plasma jet.

9. The method of claim 8 wherein the plasma treatment is continued for about 0.5 hours and the temperature of the body is maintained at about 1200 to about 1400 degrees C.

10. The method of claim 8 comprising significant growth of the particulates as a result of sintering the particulates.

11. The method of claim 10 wherein the plasma treatment is carried out by plasma jet.

12. The method of claim 11 wherein the plasma jet is a d.c. arc jet.

13. The method of claim 12 comprising coating the body with diamond film in the same apparatus as used for the plasma treatment.

14. The method of claim 13 wherein the plasma treatment is continued for about 0.5 hours and the temperature of the body is maintained at about 1350 to about 1450 degrees C.

15. The method of claim 14 comprising significant growth of the particulates as a result of sintering the particulates.

16. The method of claim 15 wherein the plasma treatment is performed by plasma jet.

17. The method of claim 16 wherein the plasma jet is a d.c. arc jet.

18. The method of claim 17 comprising coating the body with the diamond film in the same apparatus as used for the plasma treatment.

* * * * *